United States Patent [19]

Hedstrom et al.

[11] Patent Number: 5,159,281

[45] Date of Patent: Oct. 27, 1992

[54] DIGITAL DEMODULATOR USING NUMERICAL PROCESSOR TO EVALUATE PERIOD MEASUREMENTS

[75] Inventors: Mark D. Hedstrom, Naples; Robert B. Porter, Bonita Springs; Charles R. Crego, Frt. Myers, all of Fla.

[73] Assignee: NSI Partners, Naples, Fla.

[21] Appl. No.: 794,150

[22] Filed: Nov. 20, 1991

[51] Int. Cl.⁵ .............................................. H03D 3/00
[52] U.S. Cl. .................................. 329/312; 329/321; 329/341; 375/80; 375/95
[58] Field of Search ................. 329/300, 301, 303–305, 329/310–314, 321, 327, 329, 335, 340–343, 345; 455/214, 337; 375/80, 82, 94–96

[56] References Cited

U.S. PATENT DOCUMENTS 4,412,339 10/1983 Alfke et al. ............................ 375/95
4,992,748 2/1991 Gard .................................... 329/321

OTHER PUBLICATIONS

Thomas, D. M., "Heath's Digital FM Tuner," *Radio-Electronics*, May 1973, pp. 42-45, 50, 98.
Krauss, H. L., Bostian, C. W., and Raab, F. H., *Solid State Radio Engineering*, pub. by John Wiley & Sons, 1980, pp. 254-255, 315-317.
R. J. Higgins, *Digital Signal Processing in VLSI*, publ. by Prentice-Hall, 1990, (FIG. 5.6) and p. 268.
Bendat, J. S. and Piersol, A. G., *Random Data: Analysis and Measurement Procedures*, 2nd Edition, publ. by Wiley Interscience, 1986, p. 340.
Oppenheim, A. V., and Schafer, R. W., *Digital Signal Processing*, publ. by Prentice-Hall, 1975, pp. 242, 408-409.

*Primary Examiner*—Siegfried H. Grimm
*Attorney, Agent, or Firm*—Weingarten, Schurgin, Gagnebin & Hayes

[57] ABSTRACT

A digital demodulator provides efficient demodulation of frequency modulated, pulse-width modulated, and other temporally modulated signals. Without employing an analog-to-digital converter, modulating signal information is extracted from a modulated signal as numerical information. For frequency demodulation, a high gain stage is applied to an incoming FM signal to produce a corresponding sequence of square waves. The period between zero-crossings of the square waves is accurately measured to within one clock pulse using a high-speed clock and at least one counter. Period information is then provided to a numerical processor, wherein it is at least scaled and low-pass filtered to produce a high-quality demodulated signal with a high signal-to-noise ratio.

15 Claims, 3 Drawing Sheets

DIGITAL DEMODULATOR USING NUMERICAL PROCESSOR TO EVALUATE PERIOD MEASUREMENTS

FIELD OF THE INVENTION

This invention relates to a method and apparatus for detecting and demodulating signals with temporally modulated features, and particularly to frequency modulated signals.

BACKGROUND OF THE INVENTION

In Frequency Modulation (FM), a sinusoidal carrier signal of constant amplitude and frequency is modulated by an input signal of a lower frequency and of varying amplitude. FM thereby produces an output signal that is constant in amplitude, varying in frequency in accordance with the input signal, and within a specified frequency range called the deviation bandwidth. In particular, the instantaneous amplitude of the input signal is linearly transformed into a change $d\omega$ in the instantaneous frequency $\omega(t)$ of the carrier frequency $w_c$. To recover the input modulating signal from the output modulation signal, frequency demodulation must be performed using an FM demodulator.

FM demodulators are well known, and consist of devices such as ratio detectors, Foster Seeley discriminators, phase-locked loop detectors, pulse-counting detectors, and quadrature or coincidence detectors. All of these demodulators—whether implemented as analog or digital apparatus—pass data to post-processing stages, and ultimately to an output amplifier.

For example, the Heathkit AJ-1510 Digital FM Tuner employs a digital discrimination technique for demodulating a frequency modulated signal. The discriminator is of the pulse position modulation type, is inductorless and diodeless, and contains two integrated circuits: a retriggerable monostable multivibrator, and an operational amplifier. An input signal at the retriggerable monostable multivibrator causes it to change states for a fixed period of time, as determined by an RC network to provide a sequence of pulses of constant width and amplitude that are generated at about one-half of the IF rate. Each pulse represents a zero-crossing event. Signal information is represented as deviations in the frequency of the zero-crossing pulses from a constant IF frequency.

In a pulse integration type of FM demodulator, the frequency modulated signals typically ar amplified and "hard-limited" to produce square waves which have zero-crossings spaced in the same manner as the zero-crossings of the FM signals. The square waves are then converted into a sequence of constant width and amplitude pulses, one pulse for each zero-crossing of the modulated input signal. Each pulse is integrated (or filtered) and subsequently differentiated to reproduce the modulating input signal information.

There are pulse integration demodulators that employ a single one-shot multivibrator that is triggered at each zero-crossing. However, recovery time difficulties are encountered during high frequency operation because the internal delay of the multivibrator approaches the period of the high frequency signals as the operating frequency is increased.

In another form of pulse integration demodulator, a source of frequency modulated signals is coupled to a coincidence detector by a first and second signal path. The first and second signal paths have unequal signal delay characteristics, so that the coincidence detector provides an output signal that includes a series of constant width pulses, wherein pulse width is determined by a difference in signal delay between the first and second signal paths. A low pass filter is coupled to the coincidence detector to recover the signal modulation represented by the series of constant width pulses. However, this form of pulse integrator exhibits operating disadvantages due to non-linearity of the integrating network which impairs its ability to perform sufficiently precise integration on the applied signal pulse train.

SUMMARY OF THE INVENTION

An apparatus and method is provided for demodulating a frequency modulated (FM), pulse-width modulated (PWM), or other temporally modulated signal. Without employing an analog-to-digital converter, modulating signal information is extracted from a modulated signal as numerical information. To demodulate an FM signal, for example, a high gain stage is applied to an incoming FM signal to produce a corresponding sequence of square waves. The period between zero-crossings of the square waves is precisely measured and represented numerically using a high-speed clock and at least one counter. Numerical period information is then provided to a processor, wherein it is at least scaled and low-pass filtered to produce a high-quality demodulated signal with a high signal-to-noise ratio.

After a received FM signal is heterodyned with a local oscillator signal, the resulting FM intermediate frequency (IF) signal is "hard-limited" to yield a hard-limited FM IF signal that substantially resembles a sequence of square waves which are provided to a sign detector for detecting zero-crossings. In preferred embodiments, the frequency of the local oscillator signal is chosen so as to yield relatively low FM IF frequencies. The sign detector is coupled to a pair of gating circuits, each gating circuit being coupled to a respective pulse counter, and to a clock. The gating circuits are alternately enabled in accordance with the instantaneous sign of the hard-limited FM IF signal. When enabled, each sample gating circuit provides a sequence of clock pulses from the clock to a respective pulse counter. Each pulse counter stores a respective count value that represents the period between zero-crossings of the hard-limited FM IF signal. The foregoing elements together constitute a digital discriminator. A numerical processor, connected to the counters of the digital discriminator, is responsive to the changing respective count values, and reconstructs in real time the original modulating input signal. The numerical processor performs calculations upon the signal including: weighting, scaling, impulse response filtering, windowing, and interpolation/decimation. Increasing the rate of the clock yields improved resolution in the reconstructed modulating signal, up to the maximum resolution of the counting circuit. Subsequent digital filtering effectively eliminates quantization noise that remains in the reconstructed input signal.

The digital demodulator of the invention exploits the linearity of digital processing to provide excellent performance. Since the demodulation method of the invention requires only low level signals (approximately 75 db $\mu$v) and introduces minimal noise, lower total noise levels result, and a high signal-to-noise ratio is achieved. Consequently, the demodulator of the invention can more easily receive weak signals, and suffers fewer "drop-outs", a problem that is now common in fringe reception areas, as well as in dense urban centers. Also, the invention reduces the need for amplification of a received signal, thereby increasing reliability and reception quality. Therefore, at a given level of transmission power, greater transmission range is possible. One potential product area is in satellite broadcast applications; a smaller antenna could be used when the method of the invention is employed within the receiver. Further, the invention can be practiced using currently available, relatively inexpensive components. Also, since it is consistent and cooperative with existing modulation standards and transmission formats, the invention actually increases the value of the currently installed base of transmission equipment. Although the invention provides benefits when included in 2-way radio, cellular telephone, and FM broadcast applications, the invention is not limited to a specific frequency band, or to a particular application.

DESCRIPTION OF THE DRAWING

The invention will be more fully understood from the following detailed description, in conjunction with the accompanying figures, in which.

DESCRIPTION OF THE PREFERRED EMBODIMENT

Figure 1:
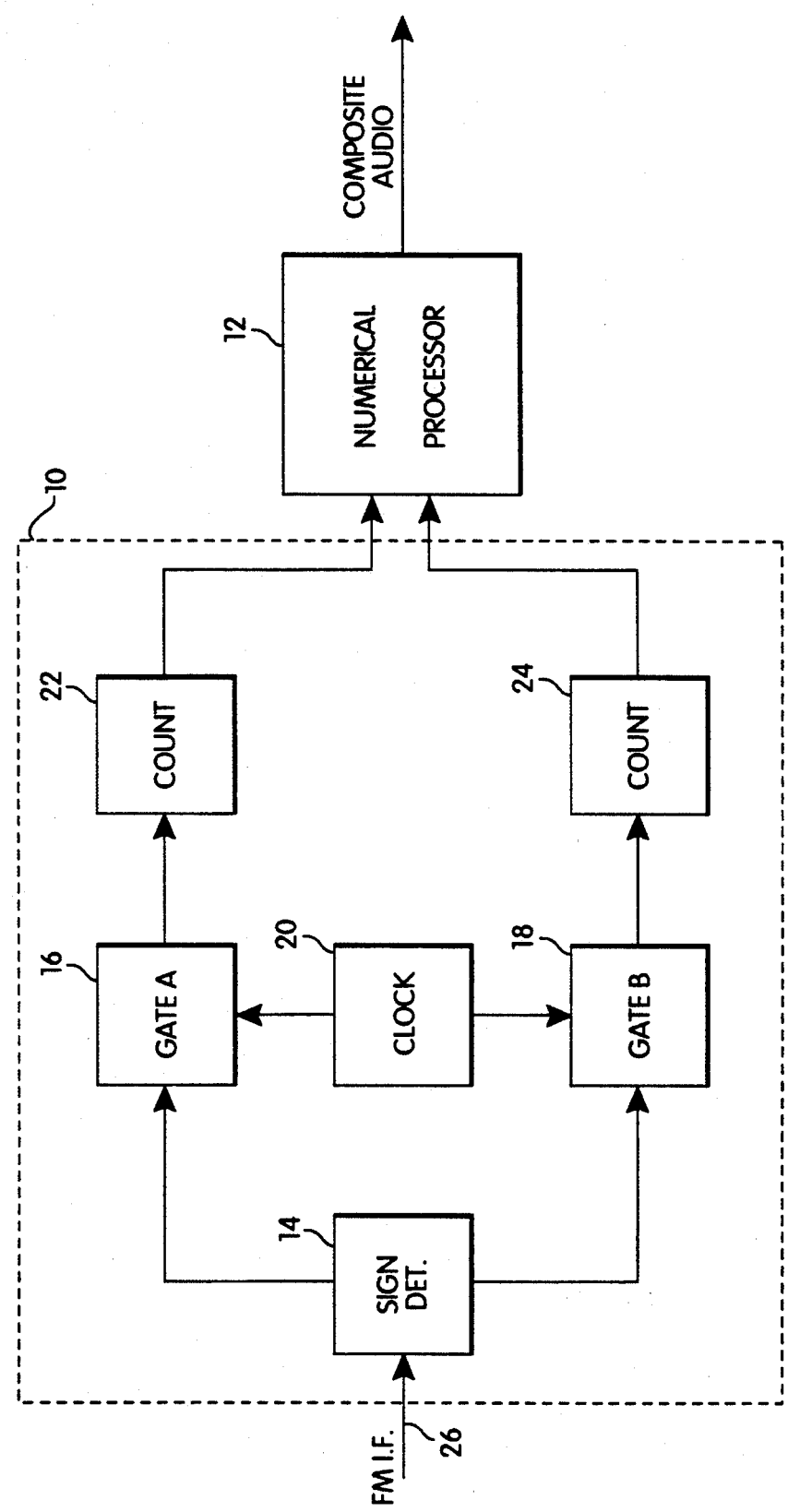
FIG. 1 is a block diagram of a digital discriminator cooperative with a numerical processor.

With reference to FIG. 1, a digital discriminator 10 is shown in cooperation with a numerical processor 12. The digital discriminator 10 utilizes zero-crossing detection and period measurement of a "hard-limited" FM IF signal to recover an associated modulating signal by exploiting the fact that the instantaneous frequency of an FM IF signal is inversely proportional to the instantaneous period of the associated modulating signal.

Discrimination is accomplished by applying a "hard-limited" FM IF signal to the sign detector 14. To form a hard-limited signal, an input signal is amplified and then clipped to provide what is essentially a square wave. The sign detector 14 ascertains the instantaneous polarity along each corresponding half-cycle of the FM IF signal, thereby defining the moment of each zero-crossing. The period between zero-crossings is determined by providing information regarding the moment of each zero-crossing to gating circuits 16 and 18. The gating circuits 16 and 18 are alternately enabled or disabled in accordance with the instantaneous sign of the hard-limited FM IF signal provided by the sign detector 14. When enabled, each sample gating circuit provides a sequence of clock pulses from the clock 20 to a respective pulse counter 22 or 24 until the other sample gating circuit or 16 is enabled. A short sequence of clock pulses between zero-crossings corresponds to a large modulating signal amplitude, while a long sequence of system clock pulses corresponds to a small modulating signal amplitude. Each sequence of clock pulses is integrated by a respective counter 22 or 24 to provide a count value that represents the period of a half cycle of the FM IF signal. The counters 22 and 24 alternately provide count values to the numerical processor 12, which can be a commercially available digital signal processor, such as the 2101 Digital Signal Processor by Analog Devices.

Figure 2:
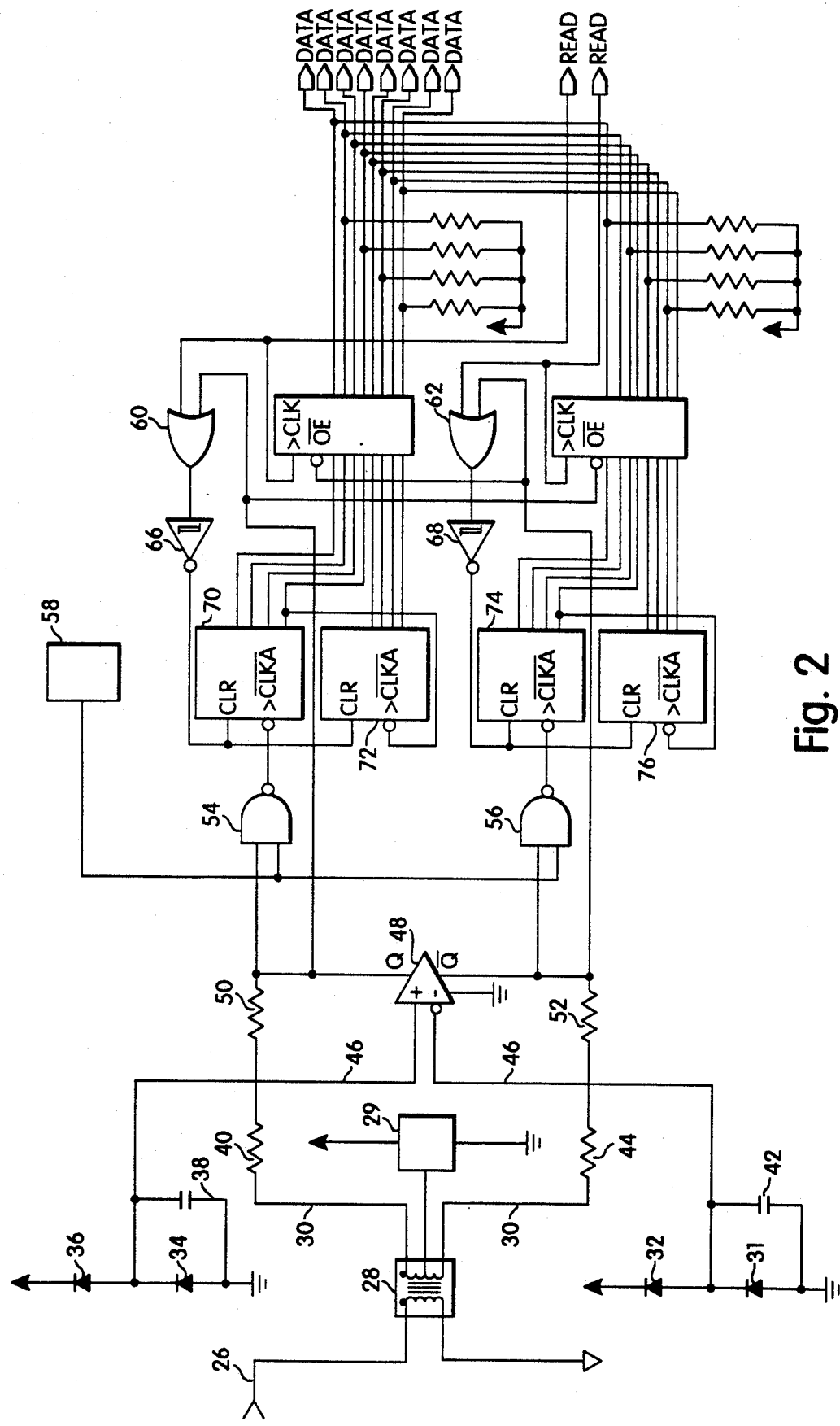
FIG. 2 is a schematic diagram of the digital discriminator of FIG. 1.

Referring to FIG. 2, a preferred embodiment of the discriminator 10 of FIG. 1 will now be discussed. A hard limited IF FM signal 26 is applied to the primary winding of transformer 28. This transformer stage provides the required impedance matching to the preceding circuit stages and dc decoupling or blocking to the succeeding stage. The center tap of the secondary of transformer 28 is biased by a reference voltage source 29 at the mid-point of the circuit supply voltage to provide a DC reference voltage. The reference voltage source 29 establishes a voltage level about which the oppositely phased voltages developed across the secondary winding of transformer 28 are symmetrical. These oppositely phased voltages represent zero-axis crossings corresponding to the zero-crossings of the modulated IF FM signal. The signal 30 from the transformer 28 is limited in amplitude by small signal diodes 31-36, and is low pass filtered by resistor and capacitor pairs 38, 40 and 42, 44. This limited and filtered signal 46 is applied in a differential manner to the inverting and non-inverting inputs of comparator 48. Switching hysteresis is provided by applying positive feedback from both Q and /Q outputs via resistors 50 and 52, respectively. The comparator outputs Q and /Q produce gate pulses proportional in width to the zero crossings of the FM IF signal. This gate pulse is applied to one of the inputs on each of the NAND gates 54 and 56. Clock 58 provides a source of high frequency clock pulses which is similarly applied to the other inputs of NAND gates 54 and 56. The resultant output of NAND gates 54 and 56 contain multiple sample clock periods wherein the number of sample clock periods ar directly proportional to the width of the gating pulse. Comparator 48 outputs Q and /Q are applied to one input of OR gate 60 and 62 to be combinatorially or'd with the /READ signal to provide a /CLR=/Q * /RD function which is subsequently fed to inverter gates 66 and 68 for signal inversion and is then applied to the clear inputs of counters 70 and 72, and counters 74 and 76. The counter clear operation occur during the READ operation for each counter 70-76 on each alternating half cycle of the gate pulses produced at Q and /Q of comparator 48. The UP counters 70-76 count clock transitions applied to the clock input of the first 4-bit counter stage during a positive or high level at either Q or /Q of comparator 48. Each counter 70-76 alternately counts during each half cycle of the FM signal. Each counter is then cleared during the opposite counters "UP" count period. The count information of each counter is latched into the corresponding 8-bit latch on the rising edge of the alternate counters "gate pulse" Q and /Q. This allows the data to be latched before the information is cleared from the counter during the next valid clear signal. Period information in the form of "count values" are subsequently read from each counter on an alternating basis. Data is available to the data bus during a valid /READ signal from the numerical processor.

The numerical processor 12 of FIG. 1 will now be discussed. The advent of digital signal processing (DSP) chips has allowed the development of real-time DSP applications. Prior to DSP-specific chipsets, the operating speeds of conventional Von Neumann processors prohibited their application to real-time digital signal processing. Current DSP microprocessors are typically based on the "Harvard Architecture". The primary difference between the Harvard-type and the Von Neumann-type architectures is the separate data and instruction buses within the Harvard Architecture chip. This bus scheme allows for simultaneous data and program memory fetches.

Another important innovation in DSP chip technology is the so-termed single cycle instruction set. This capability allows each instruction in a DSP chip to be executed in one clock cycle, brought about by implementing the instruction sets of DSP chips as part of the architecture itself, rather than in microcode, as is common in most non-DSP processors.

To further enhance the operating speed of DSP processors, chip manufacturers added parallelism and pipelining functions to the Harvard Architecture devices. Parallelism refers to the capability of a signal processing device to carry out more than one operation at a time. For example, data may be read from the parallel data bus via a parallel input/output port, while the address of the incoming data is being placed into the shifter stack and the next program instruction is concurrently being fetched from the instruction stack. Conversely, it is also possible to transmit previous results from the serial port of the processor to the DAC during data processing steps. An excellent "pseudocode" example of parallelism in a DSP processor is as follows: fetch an instruction; compute the next instruction's address; perform one or two data transfers; update one or two data address pointers; and perform a computation, all within a single cycle.

"Pipelining" refers to a process whereby the result(s) of a first operation within the processor are immediately available as input(s) to a second operation, without the added requirement that data be moved via a program step. For example, the result of a shifter operation may be directly used as an input to a multiplier accumulator section. In this context, pipelining is considered only one level deep. Future processors will most likely allow for several levels of pipelining. These innovations have enabled DSP chips to process large quantities of data much faster than previously thought possible, making real-time data-processing a reality.

According to the invention, further computational efficiencies are obtained by choosing a computationally optimal order for executing mathematically equivalent statements. Although the order of operations typically does not matter in arithmetic, it does influence computational speed considerably. For example, (Add, then multiply) = (Multiply, then add)

$(A+B) * (C+D) = AC + AD + BC + BD$

Both sides are identical mathematically, but the left half takes two "adds" and one "multiply", while the right half takes three "adds" and four "multiplies", providing a significant difference in computational overhead.

The instructions executed by the numerical processor 12 exploit all of the abovementioned efficiencies to perform computations in an extremely efficient manner, thereby providing extra time for performing additional instructions. Furthermore, any new means for enhancing performance of the numerical processor 12 that may become available in the future will serve to enhance the performance of the apparatus and method of the invention. Moreover, the apparatus and method of the invention is not limited to any particular numerical processor, or any DSP in particular.

The numerical processor 12 of FIG. 1 receives zero-crossing interval information from the counters 22, 24, and performs a differentiation process, to be described below, on successive interval values to recover modulating amplitude information. Since there are two zero-crossing events in a sinusoidal wave, an instantaneous frequency value F(t) can be recovered by taking the reciprocal of twice the period T(t) between successive zero-crossing events. Thus, $$F(t) = 1/(2 * T(t)). \quad (1)$$

The zero-crossing periods T(t) are given (within the limits of quantization) by:

$$T(t) = N(t) * Tclock, \quad (2)$$

where "N(t)" is the number of "counts", i.e., clock pulses, within a given zero-crossing period, and "Tclock" is the period of the clock, i.e., the time between clock pulses. Quantization errors e(t) exist due to ambiguities in the pulse counting process. During a clock period, an actual zero-crossing could take place at any point in time from:

$$T = (N - 0.5) * Tclock \text{ to } T = (N + 0.5) * Tclock,$$

giving an uncertainty e(t) in the knowledge of the exact moment of a zero-crossing of:

$$e(t) = \pm 0.5 * Tclock. \quad (3)$$

The accuracy of the digitization process is therefore dependent upon the frequency of the clock. As the clock speed "Fclock" increases, the uncertainty in a given measurement decreases, since Fclock = 1/Tclock. A typical system clock speed is 50 Megahertz, which results in an uncertainty e of ±10 nanoseconds, as calculated from equation (3). The mean error in e(t) is zero, since the ideal quantization error probability density function is symmetric. Also, the standard deviation is approximately 0.29*Tclock, which is also the rms value of the uncertainty e(t). The rms value of e(t) can also be considered as a measure of signal noise due to digitization. For example, if the maximum period between zero-crossings is quantized using 256 quantizing increments, the peak signal-to-rms-noise ratio would be 0.4%, or about 48 db.

The actual number of quantizing increments, i.e., clock pulses that fit within a zero-crossing period is bounded by the deviation frequency (DF) bandwidth. The width of a zero-crossing period is simply the clock frequency divided by twice the quantity "IF frequency ± the DF frequency". Thus, the maximum number of clock pulses in a digitized sample is given by:

$$Nmax = Fclock/(2(IF - DF)), \quad (4)$$

while the minimum number of clock pulses in a digitized sample is given by:

$$Nmin = Fclock/(2(IF + DF)). \quad (5)$$

To determine the resolution width after digitization, subtract equation (5) from equation (4) to obtain:

$$DN = Fclock * DF/(IF^2 - DF^2). \quad (6)$$

The actual count N is represented as a binary coded decimal (BCD) in the counter stage 70-76, and is transferred through the latches 80-82, and into the numerical processor 12, with "n-bit" resolution. The actual sample resolution n, valid to within the 1-bit error term e(t), is given by:

$$n = \text{Log}_{10}(DN)/\text{Log}_{10}(2) = 3.32 \, \text{Log}_{10}(DN) \tag{7}$$

and the fullscale sinewave RMS signal to RMS noise ratio in Nyquist bandwidth is given by:

$$SNR = 6.02n + 1.76 \, dB = 20 \, \text{Log}_{10}(DN) + 1.76 \, dB. \tag{8}$$

Count values provided to the numerical processor 12 are scaled and weighted, as explained below, to exploit the full n-bit range of the numerical processor. Next, one or more of the following processes is used: a "windowing" process for pulse averaging, using a Rectangular Window, or a Hamming Window, for example, and for providing data filtering and a preliminary treatment of digital quantization errors; and low-pass filtering, for limiting the data to a specific frequency band, and for removing noise, thereby improving the signal-to-noise ratio. Data thus processed by the numerical processor 12 is subsequently provided to a digital-to-analog converter (DAC).

Scaling and weighting of count values is governed by the equation:

$$A(i) = a * N(i) + b \tag{9}$$

where a and b are scaling and weighting constants, respectively, N(i) represents the "i"th time-period count value between zero-crossings "i−1" and "i", and A(i) is the "i"th scaled and weighted count value. Given the incoming binary pulse-count data N(i) provided by the counters 22 and 24, the system implements equation (9) to provide complete demodulation of an FM IF signal, in the sense that a voltage proportional and commensurate with the "number" A(i) is output to the DAC.

The constants a and b, are found using the full-scale positive (FSP), and full-scale negative (FSN) DSP processor values. The FSP and FSN values are determined by the "full-range" n-bit value, e.g., 65,536 for 16 bits, such that FSP is equal to (Full-Range)/2−1, and FSN is equal to −(Full-Range)/2, expressed in a two's complement binary representation. As such, a and b are given by:

$$FSP = a * Nmin + b \tag{10}$$

and $$FSN = a * Nmax + b, \tag{11}$$

such that $$a = (FSP - FSN)/(Nmin - Nmax) \tag{12}$$

and $$b = FSP - [(FSP - FSN)/(Nmin - Nmax)] * Nmin. \tag{13}$$

When simple pulse-averaging is used, a so-termed rectangular averaging window of width M slides over the scaled and weighted count values A(i), where M is the number of count values within the averaging window, and the M count values are averaged together to provide an average scaled and weighted count value A(j) over the last M count values. A value A(j) can be generated for each A(i) by advancing the window by one count value to A(i+1), or a value A(j) can be generated for every nth count value A(i+n) to reduce the data rate, thereby allowing more time for other operations. In a preferred embodiment, M=2 and n=2, so the window includes two count values and advances by two count values at a time, thereby halving the data rate. Other combinations of n and M can also be used. The average scaled and weighted count value A(j) is given by:

$$A(j) = (1/M) * \text{SUM}(A(i)), \tag{9b}$$

where A(i) is given by equation (9), i=h, h−1, . . . h−(M−1), and h is the index i of the current count value A(i).

Window functions such as the simple window averaging just described are used to pre-condition incoming data. Other typical window functions are, for example, of the Hamming or Von Hann type, that generally serve to deemphasize the effect of certain coefficients within a sliding window, while augmenting the effect of others within the window. The Hamming window coefficients $w_H(n)$ are of form:

$$w_H(m) = 0.54(1 - 0.8519 \cos (2 \, pi * m/(M-1))), \tag{14}$$

while the Von Hann window coefficients wv(n) are given by:

$$w_v(m) = 0.50(1 - \cos (2 \, pi * m/(M-1))), \tag{15}$$

with m=1, . . . M, and M=the number of count values A(x) in the window. For example, when M=3, $w_H(m)$=[a, b, c], where a, b, and c are constants computed according to equation (14). The window can advance by one or more count values, and upon each advance, the inner product of the array $w_H(m)$ and the array of values within the window is computed to yield a scalar quantity. To reduce the data rate, the window can advance by more than one value each time it advances. The Hamming or Von Hann window function can be used in addition to, or in place of, the simple rectangular window averaging scheme discussed above.

Next, the method of the invention employs low-pass filtering to reduce inband noise, and smooth out residual quantization jitter. The filters used include, but are not limited to, direct form (DF), finite impulse response (FIR), and infinite impulse response (IIR) filter realizations. The direct form filter, for example, has the following form, $$A(x) = \sum_{k=1}^{J} a_k A(x-k) + \sum_{k=0}^{L} b_k N(x-k) \tag{16}$$

where, A(x), the filter output, is the result of the recursion step where previous outputs, A(x−k), are convolved with IIR coefficients $a_k$, and previous inputs are convolved with FIR coefficients $b_k$.

In the current embodiment, a low order (e.g. 5-10 zeros and poles) IIR Butterworth filter is applied to a signal template, in real time, just prior to signal output to the DAC stage. A Butterworth filtering technique was chosen due to its exceptionally flat passband response, and approaches a true "brick-wall" type filter in its digital realization.

Figure 3:
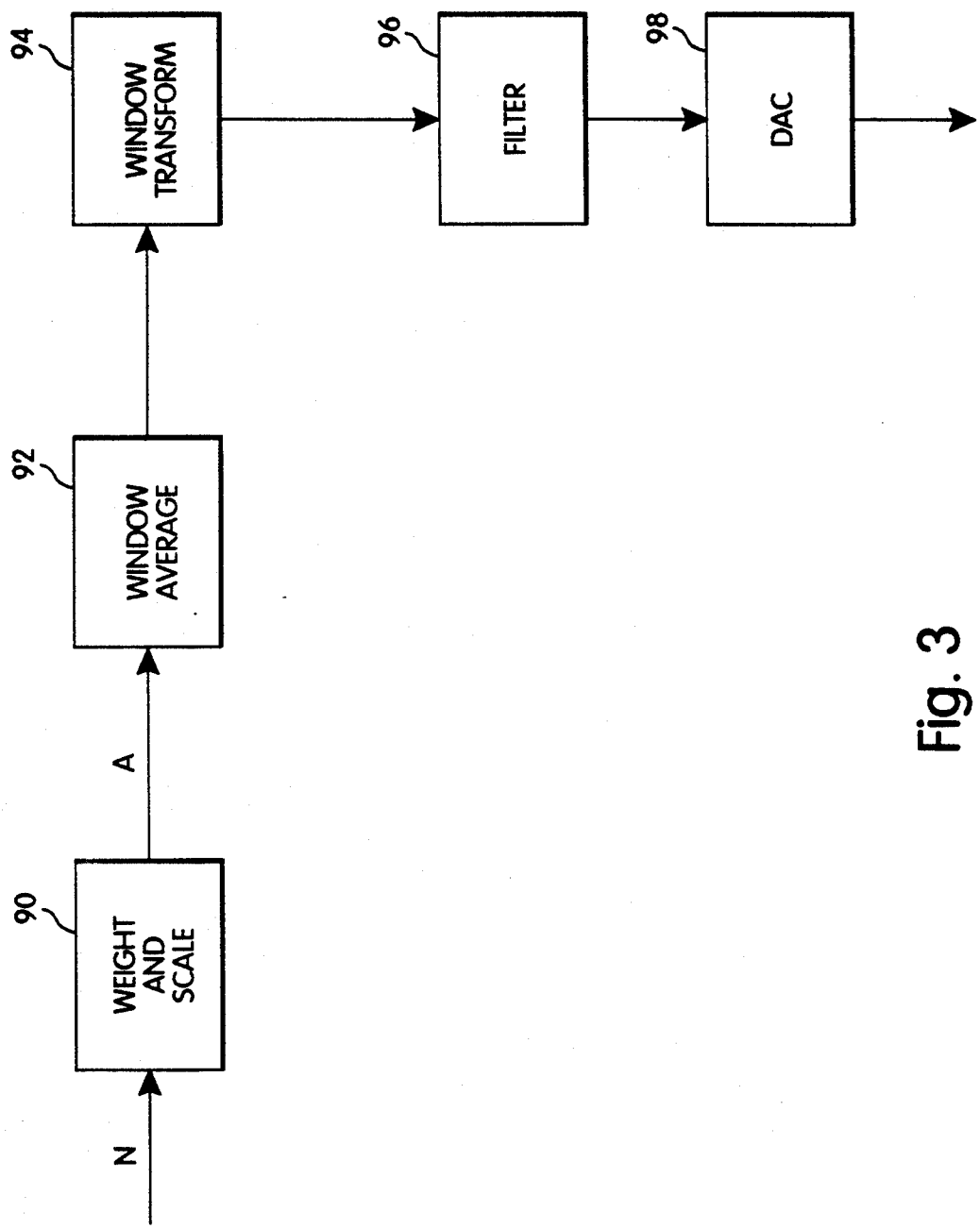
FIG. 3 is a flow diagram of a process implemented by the numerical processor of FIG. 1.

In summary, FIG. 3 illustrates the sequence of processes used to transform the sequence of count values provided by the discriminator 10 of FIG. 10 to the numerical processor 12. The values N are first weighted and scaled (90), and then are window averaged (92), thereby reducing the rate of data passed to subsequent calculations. In a preferred embodiment, a window transformation technique, such as a Hamming or Von Hann transformation (94), is then used. The data is then filtered (96) by a low-pass filter, just prior to being introduced to the DAC step (98).

Other modifications and implementations will occur to those skilled in the art without departing from the spirit and the scope of the invention as claimed. Accordingly, the above description is not intended to limit the invention except as indicated in the following claims.

What is claimed is:

1. A digital demodulator for efficient demodulation of temporally modulated signals, the demodulator comprising:

a zero-crossing event detector, responsive to a temporally modulated signal, that serves to detect zero-crossing events of said temporally modulated signal, and thereby provide zero-crossing event information;

a period measurer, connected to said zero-crossing detector, that serves to receive said zero-crossing event information and measure the period between said zero-crossing events, thereby providing a sequence of period measurement values; and a numerical processor, connected to said period measurer, that serves to convert said sequence of period measurement values into a demodulated signal with a high signal-to-noise ratio.

2. The digital demodulator of claim 1 wherein said numerical processor includes:

a digital data stream generator that receives and converts said sequence of period measurement values into a digital data stream representative of said demodulated signal; and an digital-to-analog converter that receives said digital data stream and provides said demodulated signal.

3. The digital demodulator of claim 1 wherein said numerical processor converts said sequence of period measurement values into said demodulated signal in real time.

4. The digital demodulator of claim 1 wherein said zero-crossing detector provides zero-crossing event information as a sequence of square waves with zero-crossings commensurate with the zero-crossings of said temporally modulated signal.

5. The digital demodulator of claim of claim 1 wherein said period measurer includes:

a clock;
a counter; and
a clock pulse gate, connected to said clock, said counter, and said zero-crossing detector, that permits clock pulses to propagate from said clock to said counter in response to zero-crossing event information provided by said zero-crossing detector.

6. The digital demodulator of claim 5 further including:

a second clock pulse gate, connected to said clock and said zero-crossing detector; and a second counter, connected to said second clock pulse gate.

7. A method for demodulating a temporally modulated signal, the method comprising the steps of:

measuring the period between zero-crossings of an intermediate signal of a modulated signal to provide a sequence of period values; and numerically processing said sequence of period values to provide a demodulated signal.

8. The method of claim 7 wherein the step of numerically processing includes the steps of:

weighting and scaling said sequence of period values to provide a sequence of weighted and scaled values;

filtering said sequence of weighted and scaled values to provide a sequence of filtered values; and converting said sequence of filtered values into an analog signal.

9. The method of claim 8 further including the step of:

after the step of weighting and scaling, and prior to the step of filtering, averaging the weighted and scaled values within a sliding window to provide a sequence of averaged values to be filtered.

10. The method of claim 9 wherein the sliding window includes two values and is advanced two values at a time.

11. The method of claim 8 further including the step of:

after the step of weighting and scaling, and prior to the step of filtering, executing a Hamming window function upon the sequence of weighted and scaled values to provide a sequence of values to be filtered.

12. The method of claim 8 further including the step of:

after the step of weighting and scaling, and prior to the step of filtering, executing a Von Hann window function upon the sequence of weighted and scaled values to provide a sequence of values to be filtered.

13. The method of claim 8 further including the steps of:

after the step of weighting and scaling, averaging the weighted and scaled values within a sliding window to provide a sequence of averaged values; and prior to the step of filtering, executing a Hamming window function upon the sequence of weighted and scaled values to provide a sequence of values to be filtered.

14. The method of claim 7 wherein the step of numerically processing includes the steps of:

weighting and scaling said sequence of period values to provide a sequence of weighted and scaled values;

averaging the weighted and scaled values within a sliding window to provide a sequence of window averaged values;

executing a Von Hann window function upon the sequence of window averaged values to provide a sequence of Von Hann values;

filtering said sequence of Von Hann values to provide a sequence of filtered values; and converting said sequence of filtered values into an analog signal.

15. The method of claim 7 wherein the step of numerically processing includes the steps of:
  weighting and scaling said sequence of period values to provide a sequence of weighted and scaled values;
  averaging the weighted and scaled values within a sliding window to provide a sequence of window averaged values;
  executing a Hamming window function upon the sequence of window averaged values to provide a sequence of Hamming values;
  filtering said sequence of Hamming values to provide a sequence of filtered values; and
  converting said sequence of filtered values into an analog signal.

* * * * *

UNITED STATES PATENT AND TRADEMARK OFFICE
CERTIFICATE OF CORRECTION

PATENT NO. : 5,159,281
DATED : October 27, 1992
INVENTOR(S) : Mark D. Hedstrom, et al.

It is certified that error appears in the above-indentified patent and that said Letters Patent is hereby corrected as shown below:

Column 1, line 23, "w" should read --$\omega$--.

Column 3, line 59, "circuit or 16" should read --circuit 18 or 16--.

Column 3, line 68, "!2" should read --12---.

Column 4, line 34, "ar" should read --are--.

Column 4, line 36, "gate" should read --gates--.

Column 4, line 42, "occur" should read ---occurs----.

Column 8, line 31, "wv(n)" should read --$w_v(n)$--.

Column 9, line 5, "FIG. 10" should read --FIG. 1--.

Column 9, line 57, "of claim of claim 1" should read --of claim 1--.

Signed and Sealed this

Seventeenth Day of May, 1994

Attest:

BRUCE LEHMAN

*Attesting Officer*     *Commissioner of Patents and Trademarks*